United States Patent [19]

Hikichi et al.

[11] Patent Number: 5,140,403
[45] Date of Patent: Aug. 18, 1992

[54] THIN-FILM SEMICONDUCTOR DEVICE HAVING AN α-TANTALUM FIRST WIRING MEMBER

[75] Inventors: Takehito Hikichi; Shigeru Yamamoto; Ichiro Asai, all of Kanagawa, Japan

[73] Assignee: Fuji Xerox Co., Ltd., Tokyo, Japan

[21] Appl. No.: 660,836

[22] Filed: Feb. 26, 1991

[30] Foreign Application Priority Data

Feb. 27, 1990 [JP] Japan ................... 2-44633

[51] Int. Cl.$^5$ ............................. H01L 23/54
[52] U.S. Cl. ......................... 357/67; 357/71; 357/65
[58] Field of Search .......... 357/23.7, 4, 67, 71, 357/65; 204/192.15; 361/305

[56] References Cited

U.S. PATENT DOCUMENTS

| | | | |
|---|---|---|---|
| 3,878,079 | 4/1975 | Schauer | 204/192.15 |
| 4,364,099 | 12/1982 | Koyama et al. | 361/305 |
| 4,905,066 | 2/1990 | Dohjo et al. | 357/23.7 |
| 4,975,760 | 12/1990 | Dohjo et al. | 357/67 |
| 5,028,551 | 7/1991 | Dohjo et al. | 357/23.7 |
| 5,067,007 | 11/1991 | Kanji et al. | 357/67 |

*Primary Examiner*—William Mintel
*Assistant Examiner*—S. V. Clark
*Attorney, Agent, or Firm*—Finnegan, Henderson, Farabow, Garrett and Dunner

[57] ABSTRACT

In a reverse staggered MOS transistor, a gate electrode and a signal wiring connected to the gate electrode consist of a wiring base on the substrate side and an overlying wiring part superposed on the wiring base. The wiring base is composed of a conductive material, e.g., tantalum-molybdenum alloy, which has a body-centered cubic lattice structure with its lattice constants the same as or approximately identical to those of α-tantalum. Being continuously deposited on the wiring base by sputtering, the overlying wiring part also assumes the α-tantalum form inheriting the lattice structure of the wiring base. In the case of a staggered MOS transistor, source and drain electrodes and respective signal wirings connected to the source and drain electrodes take the similar structure.

10 Claims, 6 Drawing Sheets

THIN-FILM SEMICONDUCTOR DEVICE HAVING AN α-TANTALUM FIRST WIRING MEMBER

BACKGROUND OF THE INVENTION

This invention relates to a thin-film semiconductor device for driving active matrix type displays, image sensors, printer heads, etc. More particularly, this invention relates to an improved thin-film semiconductor device that can operate at higher speed.

Thin-film semiconductor devices of the type contemplated by the present invention are described hereinafter with particular reference to MOS thin-film transistors. Two major types of thin-film MOS transistors are a "reverse staggered" transistor and a "staggered" transistor. A "reverse staggered" thin-film MOS transistor is shown in FIGS. 10 and 11, and its principal part is typically composed of the following components: a glass substrate g; a gate electrode gt formed on the glass substrate g; a gate insulating film h that covers the gate electrode gt; a first semiconductor layer j that is made of amorphous silicon and that is superposed on the gate insulating film h; a protective film k formed on the first semiconductor layer j; and a source electrode st and a drain electrode dt that are formed at opposite ends of the first semiconductor layer j via a second semiconductor layer m made of n+-amorphous silicon. A "staggered" thin-film MOS transistor is shown in FIGS. 12 and 13, and its principal part is typically composed of the following components: a glass substrate g; a first semiconductor layer j that is made of amorphous silicon and that is formed on the glass substrate g; a source electrode st and a drain electrode dt that are formed at opposite ends of the first semiconductor layer j via a second semiconductor layer m made of n+-amorphous silicon; signal wirings n respectively connected to the source electrode st and the drain electrode dt; a gate insulating film h that covers the first semiconductor layer j; and a gate electrode gt formed on the gate insulating film h.

In order to operate the thin-film MOS transistor of either type, a drain voltage $V_D$ is applied between the source electrode st and the drain electrode dt and, at the same time, a gate voltage $V_G$ is applied to the gate electrode gt, whereupon a channel is formed in the first semiconductor layer j and the transistor is turned on to produce a flow of drain current $I_D$. As the gate voltage $V_G$ is lowered, the channel in the first semiconductor layer j diminishes until the transistor is turned off to cease the flow of drain current $I_D$. Being operated in this way, thin-film MOS transistors are used to drive active matrix displays, image sensors, printer heads, etc.

In the fabrication of thin-film semiconductors of the type contemplated by the present invention, the "first wiring members" such as the gate electrode gt of the reverse staggered type, and the source electrode st, drain electrode dt and signal wirings n of the staggered type, that are to be formed in the first stage, must be made of a conductive material that has good adhesion to the glass substrate g (insulating substrate) and that is sufficiently heat-resistant to avoid deterioration in subsequent heat treatments. To meet these requirements, high-melting-point (refractory) metals such as tantalum (Ta), molybdenum (Mo), titanium (Ti) and chromium (Cr) have conventionally been used and, among these metals, tantalum is used most extensively since it has high resistance to galvanic corrosion and contributes to a higher withstand voltage due to the formation of an anodic oxidation film.

A problem with the use of tantalum is that when a thin Ta film is formed by the sputtering on an insulting substrate such as a glass substrate, it will assume the β-tantalum form having a tetragonal lattice structure. Since β-tantalum has relatively high electric resistance, considerable delay in signal propagation occurs in semiconductor devices that use tantalum and this has been a major obstacle to the previous attempts to increase the operating speed of those devices.

As an alternative to β-tantalum, tantalum alloys such as TaW and TaMo that have better conductivity than β-tantalum are currently used in several areas of the semiconductor industry. However, when such tantalum alloys are applied to form the gate electrode and other first wiring members, the resulting anodic oxidation film will not contribute to a higher withstand voltage. Further, such tantalum alloys are less conductive than α-tantalum.

SUMMARY OF THE INVENTION

The present invention has been achieved under these circumstances, and has an object of making it possible to deposit a film of α-tantalum having a lower resistance than β-tantalum and tantalum alloys on the surface of an insulating substrate, and thereby providing a thin-film semiconductor device that can operate at higher speed.

According to its first aspect, the present invention generally relates to a thin-film semiconductor device that comprises an insulating substrate, a semiconductor layer formed on the insulating substrate, and a first wiring member formed on the insulating substrate with at least part of the first wiring member being in surface contact with said insulating substrate. The improved feature of this device is that the first wiring member is composed of a wiring base on the substrate side which is formed of a conductive material having a body-centered cubic lattice structure with its lattice constants either the same as or similar to those of α-tantalum, and an overlying wiring part that is formed of α-tantalum superposed on said wiring base.

The term "first wiring member" as used in connection with the first aspect of the invention means a wiring member that is first formed in the process of fabricating a thin-film semiconductor device, and at least part of which is provided so as to make surface contact with the insulating substrate. Examples of the "first wiring member" include a gate electrode in a "reverse staggered" transistor, as well as source and drain electrodes and signal wirings in a "staggered" transistor. The wiring member that is first formed in the process of fabricating a bipolar thin-film transistor is another example of the "first wiring member".

With the above arrangement, the overlying wiring part superposed on the wiring base grows inheriting the body-centered cubic lattice structure of the wiring base in such a way that it becomes composed of α-tantalum of a body-centered cubic lattice structure having a lower resistivity, whereby the conductivity of the first wiring member is improved.

According to its second aspect, the present invention generally relates to a thin-film semiconductor device comprising a plurality of thin-film semiconductor elements and an active matrix wiring circuit provided on a common insulating substrate, in which both a first signal wiring of the active matrix wiring circuit and an electrode on the substrate side which is part of each thin-film semiconductor element are provided on said insulating substrate so as to be integral with each other and to make surface contact with the insulating substrate. The improved feature of this device is that the first signal wiring of the active matrix wiring circuit is composed of a wiring base on the substrate side formed of a conductive material having a body-centered cubic lattice structure with its lattice constants either the same as or similar to those of α-tantalum, an intermediate overlying wiring part formed of α-tantalum superposed on said wiring base, and a top overlying wiring part formed of α-tantalum superposed on the intermediate overlying wiring part, and that the electrode on the substrate side of each thin-film semiconductor element is composed of a single thin layer of tantalum that is integral with the top overlying wiring part of the first signal wiring.

The term "electrode on the substrate side" as used in connection with its second aspect means an electrode that is first formed in the process of fabricating a thin-film semiconductor element, and at least part of which is provided to make surface contact with the insulating substrate. Examples of the "electrode on the substrate side" include a gate electrode in a "reverse staggered" transistor, as well as source and drain electrodes in a "staggered" transistor. The term "first signal wiring" as used in connection with the second aspect of the invention means a signal wiring that is first formed in the process of fabricating a thin-film semiconductor device, and at least part of which is provided to make surface contact with the insulating substrate.

With the above arrangement, the intermediate and top overlying wiring parts of the first signal wiring superposed on the wiring base grow inheriting the body-centered cubic lattice structure of the wiring base in such a way that they become composed of α-tantalum of a body-centered cubic lattice structure having a lower resistivity. At the same time, the thickness of the first signal wiring is increased by an amount that corresponds to the thickness of the intermediate and top overlying wiring parts, whereby the conductivity of the first signal wiring in the active matrix wiring circuit is further improved than in the first aspect of the invention.

BRIEF DESCRIPTION OF THE DRAWINGS

FIGS. 7A and 7B are cross sections of FIG. 5 taken on the line VII—VII, in which FIG. 7A is a cross section of a thin-film transistor, and FIG. 7B is a cross section of an associated active matrix wiring circuit;

FIGS. 8A through 9B show the sequence of steps of forming a gate electrode and a first signal wiring in the thin-film transistor shown in FIG. 5, in which FIG. 8A is a cross section of an intermediate overlying wiring part that has been superposed on a wiring base on the substrate side of the first signal wiring, FIG. 9B is a plan view of FIG. 9A;

DETAILED DESCRIPTION OF THE PREFERRED EMBODIMENTS

Three embodiments of the present invention are described below with reference to FIGS. 1-9.

First embodiment

Figure 1:
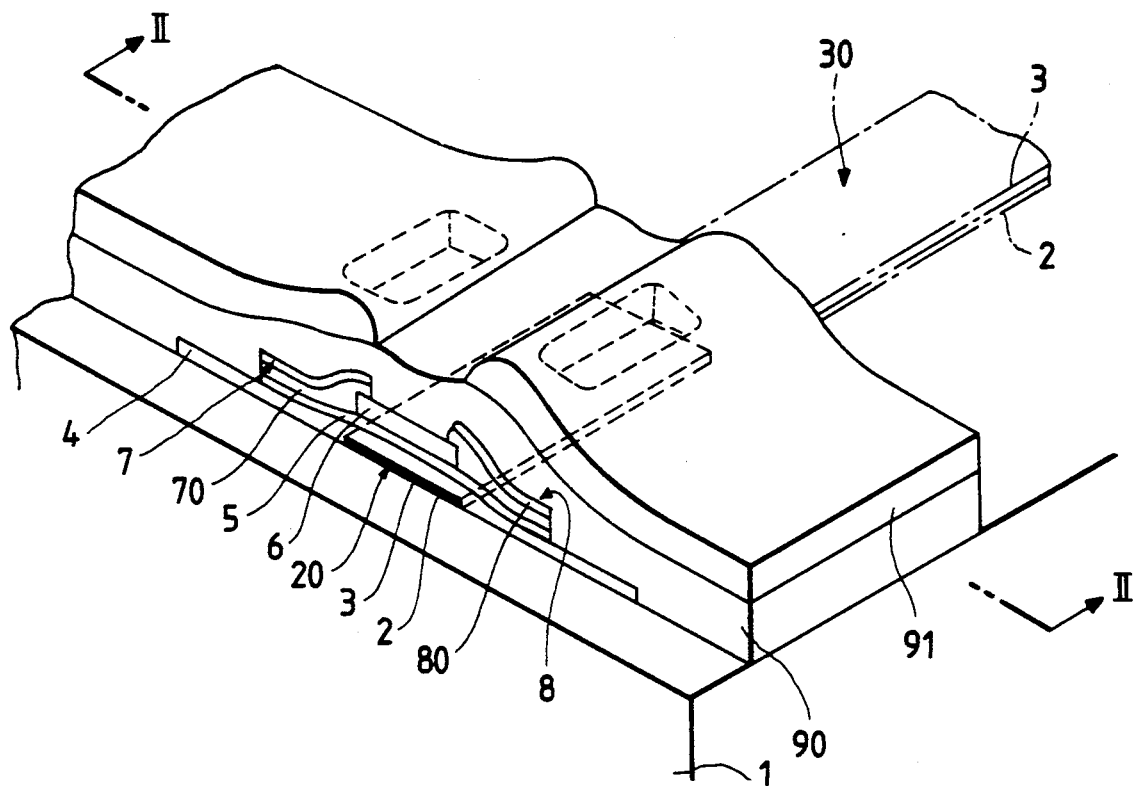
FIG. 1 is a schematic perspective view showing a thin-film transistor according to a first embodiment of the present invention.
Figure 2:
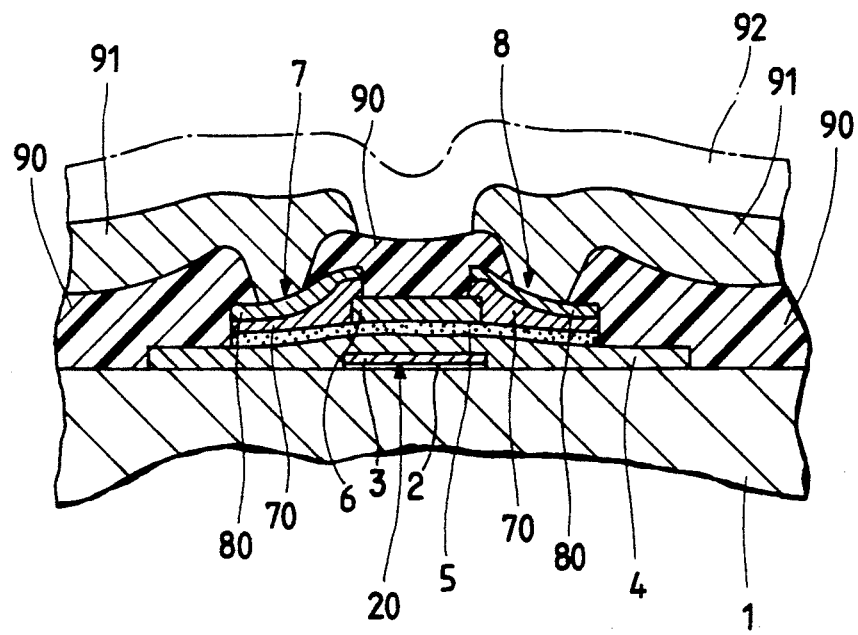
FIG. 2 is a cross section of FIG. 1 taken on the line II—II.

In this first embodiment of the present invention, the concept of its first aspect is applied to a "reverse staggered" thin-film transistor. As shown in FIGS. 1 and 2, the principal part of the transistor comprises the following components: a glass substrate 1; a gate electrode 20 and a first signal wiring 30 which are provided on the glass substrate 1 in such a way as to make surface contact therewith; a $Si_xN_y$ gate insulating film 4 that covers the gate electrode 20; a first semiconductor layer 5 made of amorphous silicon (a-Si:H) that is formed on the gate insulating film 4; a $Si_xNi_y$ top insulating film 6 provided on the first semiconductor layer 5 in the area that corresponds to the gate electrode 20; a source electrode 7 and a drain electrode 8 each composed of a second semiconductor layer 70 made of n+-amorphous silicon for establishing ohmic contact and provided on the first semiconductor layer 5 and a barrier metal layer 80 provided on the second semiconductor layer 70 and formed of Cr, Mo, Ti, Ta, W or a silicide thereof; a polyimide interlayer insulating film 90 that is deposited in such a way that the barrier metal layer 80 is partly exposed; aluminum second signal wirings 91 respectively connected to the barrier metal layers 80 via the exposing holes of the interlayer insulating film 90; and a $SiO_2$ passivation film 92 that covers all the components described above.

Figure 3A:
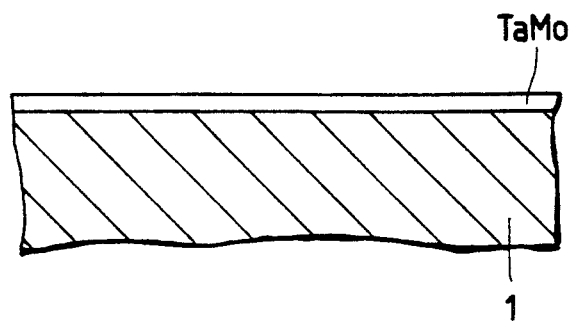
FIGS. 3A to 3C show the sequence of steps of forming a gate electrode and a first signal wiring in the thin-film transistor shown in FIG. 1.
Figure 3B:
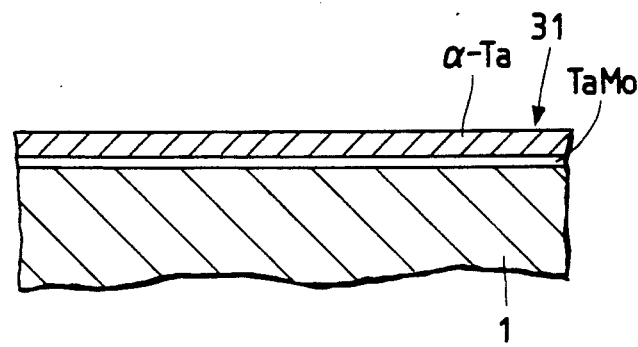
Figure 3C:
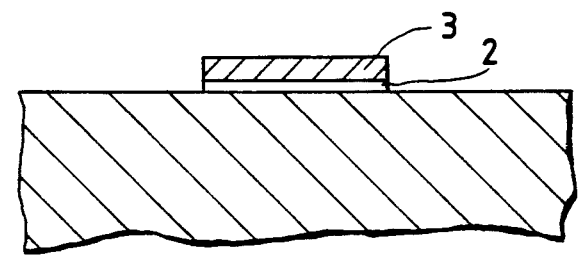

Each of the gate electrode 20 and the first signal wiring 30 is composed of a TaMo wiring base on the substrate side having a thickness of 300 Å and a tantalum overlying wiring part 3 having a thickness of 700 Å and superposed on the wiring 30, and is formed by the sequence of steps illustrated in FIGS. 3A to 3C.

First, as shown in FIG. 3A, TaMo alloy, that has a body-centered cubic lattice structure with its lattice constants similar to those of α-tantalum, is deposited as a film having a thickness of 300 Å on the glass substrate 1 by a sputtering technique. Further, a tantalum film is continuously deposited on the TaMo film until a thickness of 700 Å is reached. The growing tantalum inherits the body-centered cubic lattice structure of the TaMo alloy, and a film 31 is formed which, as shown in FIG. 3B, consists of TaMo alloy and α-tantalum superposed thereon.

In the next step, a resist (not shown) is formed on the film 31 in the area where the gate electrode and the first signal wiring are to be formed, and part of the film 31 which is exposed from the resist is removed by a dry etching method using a CF$_4$-containing etchant, whereby the gate electrode 20 and the first signal wiring 30 are formed, each of which is composed of the wiring base 2 and the overlying wiring part 3 as shown in FIG. 3C.

To other components of the thin-film transistor than the gate electrode 20 and the first signal wiring 30 are formed by the following conventional procedure. After the gate electrode 20 and the first signal wiring 30 are formed, $Si_xNi_y$ for forming the gate insulating film 4, amorphous silicon (a-Si:H) for forming the first semiconductor layer 5 and $Si_xNi_y$ for forming the top insulating film 6 are continuously deposited as successive films by a PCVD technique, and $Si_xN_y$ for forming the top insulating film 6 is patterned by a wet etching method.

In the next step, n+-amorphous silicon and Cr, Mo, Ti, Ta, W or a silicide thereof for forming the source and drain electrodes 7, 8 are deposited as successive films, which are then patterned by a wet etching method. Thereafter, polyimide for forming the interlayer insulating film 90 is deposited as a film.

Further, part of the polyimide interlayer insulating film 90 is removed, and a film of aluminum for forming the second signal wiring 91 is deposited on the polyimide film 90 by a sputtering technique. After patterning by a wet etching method, $SiO_2$ for forming the passivation film 92 is deposited on the entire surface to fabricate the desired thin-film transistor.

As in the prior art transistors, a drain voltage $V_D$ is applied between the source electrode 7 and the drain electrode 8 of the thus fabricated thin-film transistor, and a gate voltage $V_G$ is applied to the gate electrode 20, whereupon a channel is formed in the first semiconductor layer 5 to turn on the transistor. As the gate voltage $V_G$ is lowered, the channel diminishes until the transistor is turned off.

In the thin-film transistor under discussion, each of the gate electrode 20 and the first signal wiring 30 is composed of the wiring base 2 made of TaMo alloy and having a thickness of 300 Å and the tantalum overlying wiring part 3 superposed on the wiring base 2 and having a thickness of 700 Å. The overlying wiring part 3 superposed on the wiring base 2 grows inheriting the body-centered cubic lattice structure of the TaMo alloy to become composed of α-tantalum having a lower resistance value. As a result, the conductivity of the gate electrode 20 and the first signal wiring 30 is reduced to 3 Ω/□ per thickness of 1,000 Å, which is significantly lower than the value of conventionally used β-tantalum (20 Ω/□).

Hence, the thin-film transistor according to the first embodiment of the present invention has the advantage that it can operate at remarkably increased speed.

In the first embodiment described above, the concept of the first aspect of the present invention is applied to a thin-film transistor in which the first semiconductor layer 5 for channel formation is composed of amorphous silicon (a-Si:H). If desired, the same concept may be be applied to a thin-film transistor in which the first semiconductor layer 5 is composed of polysilicon because high-melting-point tantalum is used for the first wiring member.

Second embodiment

Figure 4:
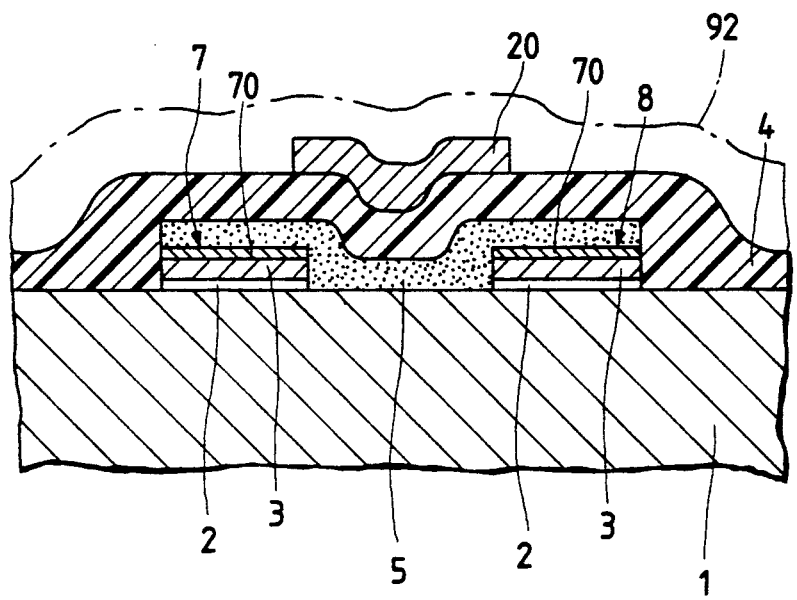
FIG. 4 is a schematic cross-sectional view showing a thin-film transistor according to a second embodiment of the present invention.

In this second embodiment of the present invention, the concept of its first aspect is applied to a "staggered" thin-film transistor. As shown in FIG. 4, the principal part of the transistor comprises the following components: a glass substrate 1; a source electrode 7, a drain electrode 8 and first signal wirings (not shown) that are provided on the glass substrate 1 in such a way as to make surface contact therewith; second semiconductor layers 70 made of n+-amorphous silicon for establishing ohmic contact, which form part of the source electrode 7 and the drain electrode 8; a first semiconductor layer 5 made of amorphous silicon (a-Si:H) and formed both on the source and drain electrodes 7, 8 and on the glass substrate 1 between these electrodes; a $Si_xN_y$ insulating film 4 that covers the surface of the first semiconductor layer 5; an aluminum gate electrode 20 that is provided on the insulating film 4; and a $SiO_2$ passivation film 92 that covers the entire surface of the components described above.

As in the first embodiment, each of the source electrode 7, the drain electrode 8 and the first signal wiring is composed of a TaMo wiring base on the substrate side having a thickness of 300 Å and a tantalum overlying wiring part 3 superposed on the wiring base 2 and having a thickness of 700 Å. Because of this arrangement, the overlying wiring part 3 superposed on the wiring base 2 grows inheriting the body-centered cubic lattice structure of the TaMo alloy to become composed of α-tantalum having a lower resistance value. As a result, the conductivity of the source electrode 7, the drain electrode 8 and the first signal wiring is reduced to as low as 3 Ω/□ per thickness of 1,000 Å.

Hence, the thin-film transistor according to the second embodiment of the present invention also has the advantage that it can operate at remarkably increased speed.

Third embodiment

Figure 5:
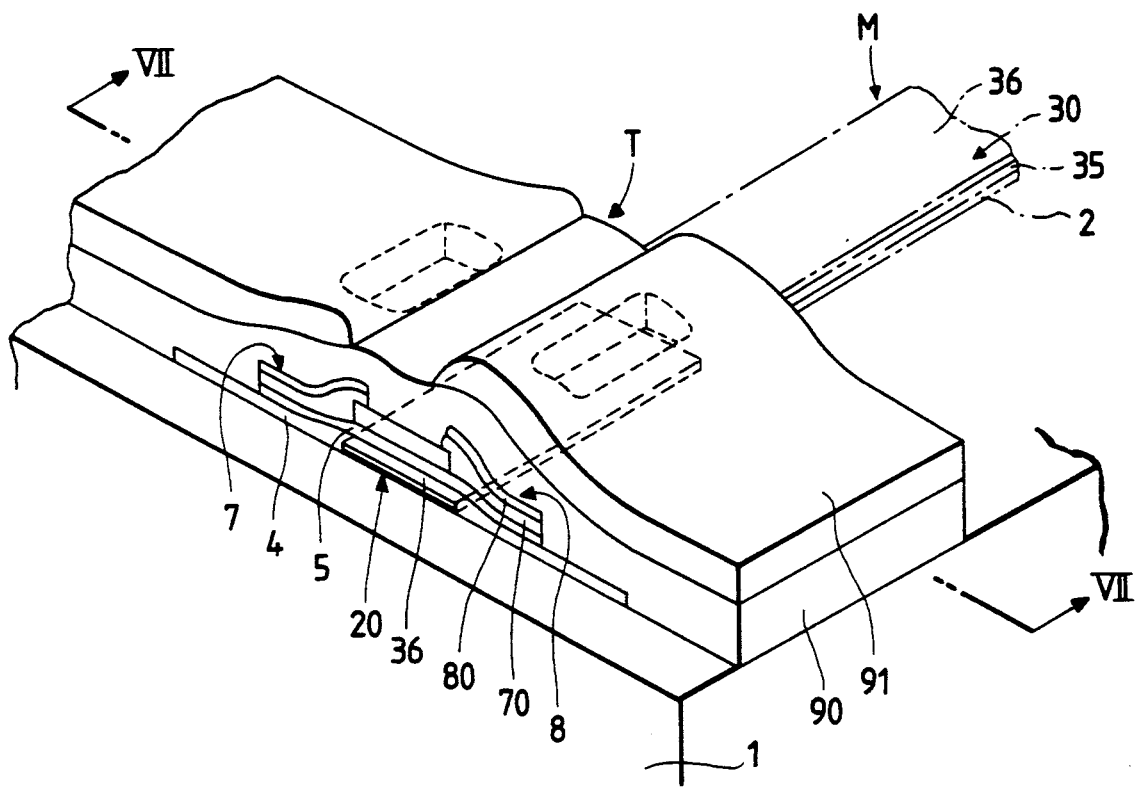
FIG. 5 is a schematic perspective view showing a thin-film transistor according to a third embodiment of the present invention.
Figure 6:
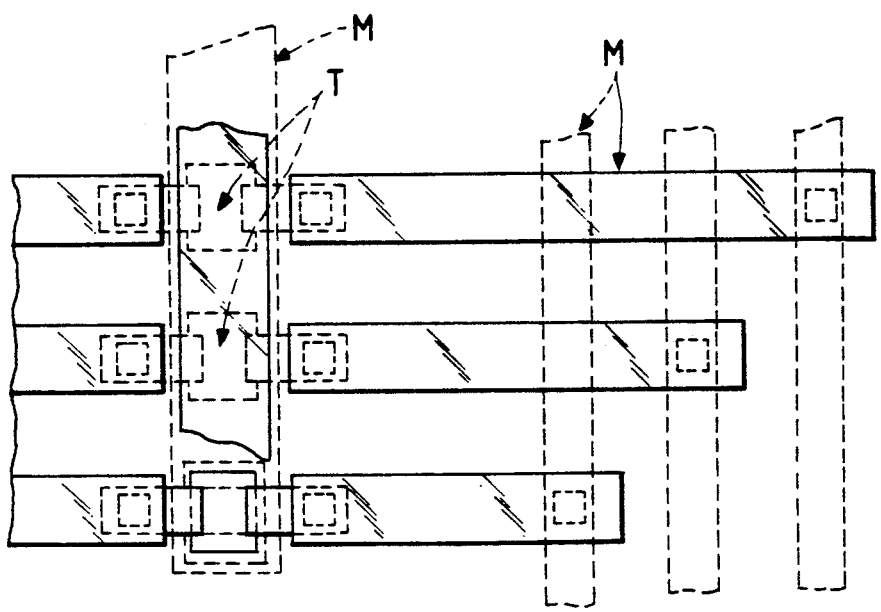
FIG. 6 is a plan view of the thin-film transistor shown in FIG. 5.

In this third embodiment of the present invention, the concept of its second aspect is applied to a plurality of "reverse staggered" thin-film transistors T which are combined with an active matrix wiring circuit M as shown in FIGS. 5–7.

The principal part of each thin-film transistor T comprises the following components: a glass substrate 1; a gate electrode 20 and a first signal wiring 30 which are provided on the glass substrate 1 in such a way as to make surface contact therewith; a $Si_xN_y$ gate insulating film 4 that covers the gate electrode 20; a first semiconductor layer 5 made of amorphous silicon (a-Si:H) and formed on the gate insulating film 4; a $Si_xN_y$ top insulating film 6 provided on the first semiconductor layer 5 in the area that corresponds to the gate electrode 20; a source electrode 7 and a drain electrode 8 each composed of a second semiconductor layer 70 for establishing ohmic contact made of n+-amorphous silicon and provided on the first semiconductor layer 5 and a barrier metal layer 80 provided on the second semiconductor layer 70 and formed of Cr, Mo, Ti, Ta, W or a silicide thereof; a polyimide interlayer insulating film 90 that is deposited in such a way that the barrier metal layer 80 is partly exposed therethrough; aluminum second signal wirings 91 respectively connected to the barrier metal layers 80 via the exposing holes of the interlayer insulating film 90; and a $SiO_2$ passivation film 92 that covers all the components described above.

Figure 7A:
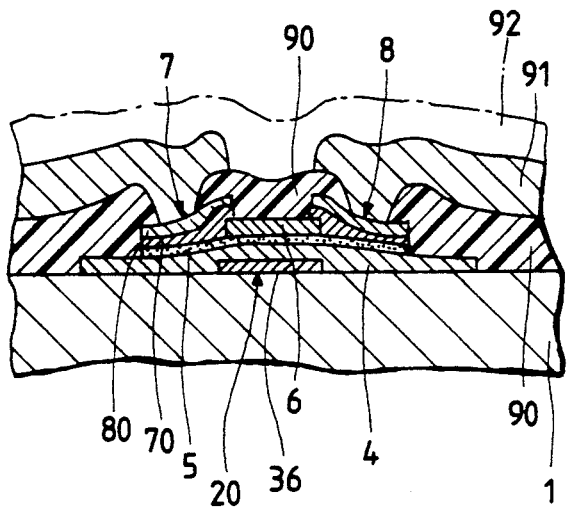
Figure 7B:
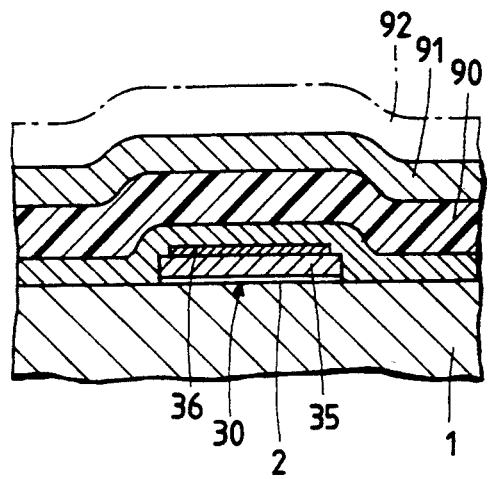

As shown in FIG. 7B, the first signal wiring 30 which forms part of the active matrix wiring circuit M is composed of the following: a wiring base on the substrate side which is made of tantalum-molybdenum (TaMo)

alloy and having a thickness of 300 Å; an intermediate overlying wiring part 35 made of tantalum (Ta) and superposed with a thickness of 1,700 Å on the wiring base 2; and a top overlying wiring part 36 also made of tantalum (Ta) and superposed with a thickness of 1,000 Å on the intermediate wiring part 35. As shown in FIG. 7A, the gate electrode 20 of 1,000 Å tantalum (Ta) is directly deposited on the surface of the glass substrate 1 so as to be integral with the top wiring part 36 of the first signal wiring 30. The gate electrode 20 and the first signal wiring 30 are formed by the sequence of steps illustrated in FIGS. 8 and 9.

Figure 8A:
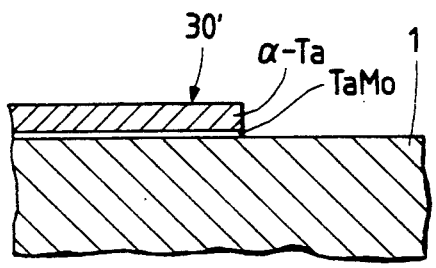
Figure 8B:
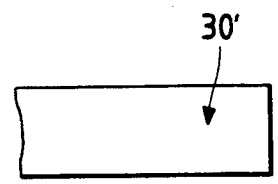
FIG. 8B is a plan view of FIG. 8A.

First, tantalum-molybdenum (TaMo) alloy, that has a body-centered cubic lattice structure with its lattice constants similar to those of α-tantalum, is deposited as a film having a thickness of about 300 Å on the glass substrate 1 by a sputtering technique. Further, a tantalum (Ta) film is continuously deposited to a thickness of about 1,700 Å. The growing tantalum inherits the body-centered cubic lattice structure of the TaMo alloy and, as a result, a film is formed that consists of TaMo alloy and α-tantalum superposed thereon. Subsequently, this film is etched by a dry etching method using a $CF_4+O_2$ gaseous etchant, whereby a first signal wiring base 30' is formed as shown in FIGS. 8A and 8B. The dry etching may be reactive ion etching (RIE) or chemical dry etching (CDE).

Figure 9A:
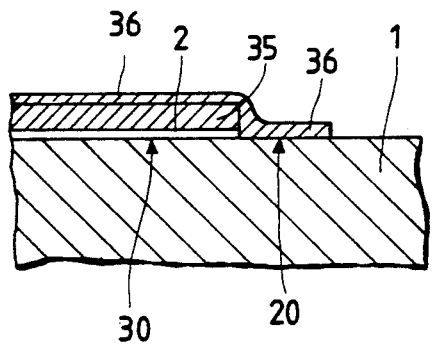
FIG. 9A is a cross section of the gate electrode and the first signal wiring that have been formed.
Figure 9B:
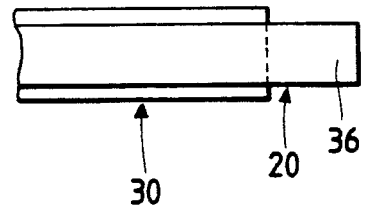
Figure 10:
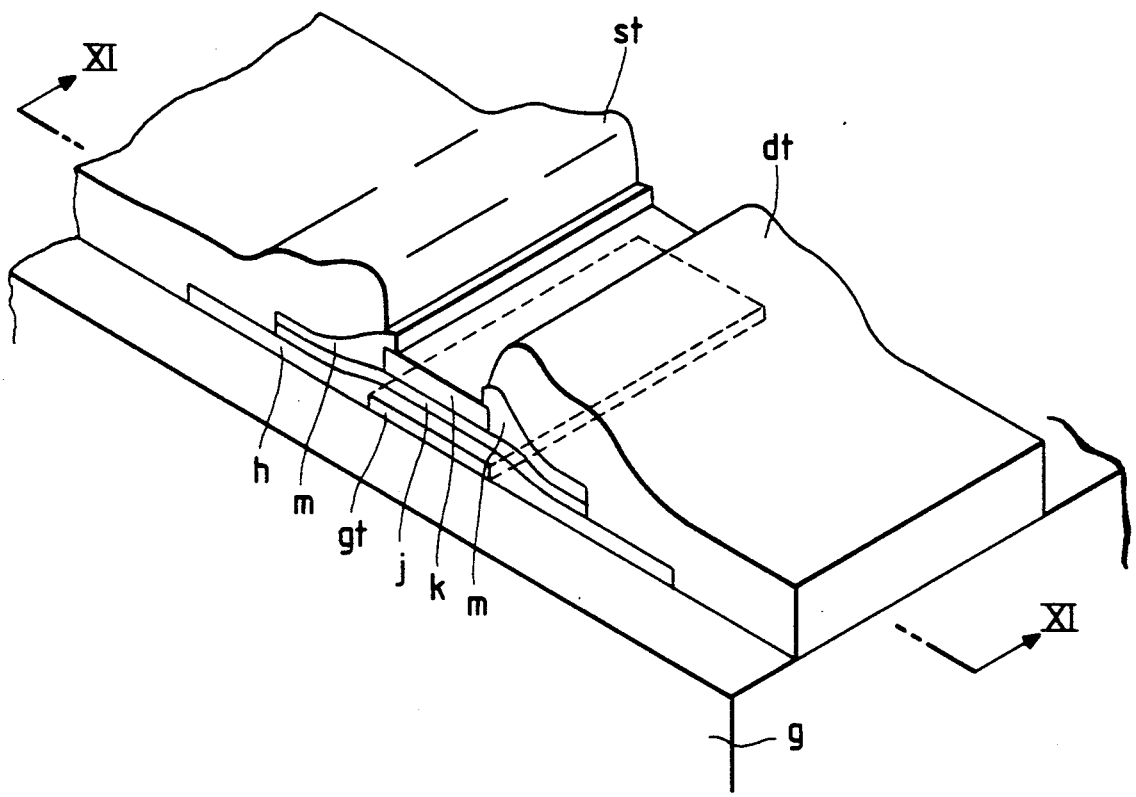
FIG. 10 is a schematic perspective view of a prior art "reverse staggered" thin-film MOS transistor.
Figure 11:
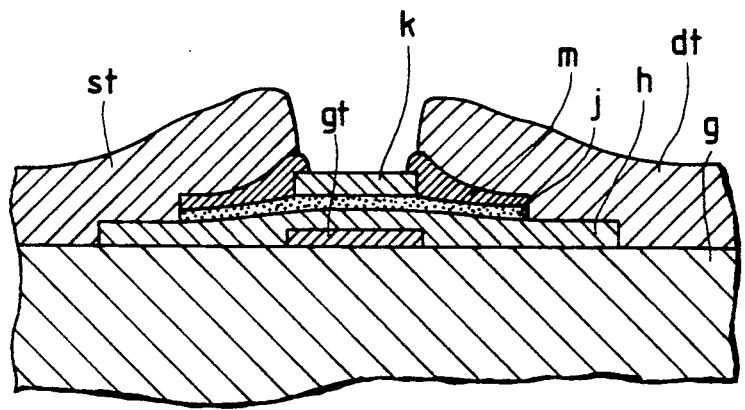
FIG. 11 is a cross section of FIG. 10 taken on the line XI—XI.
Figure 12:
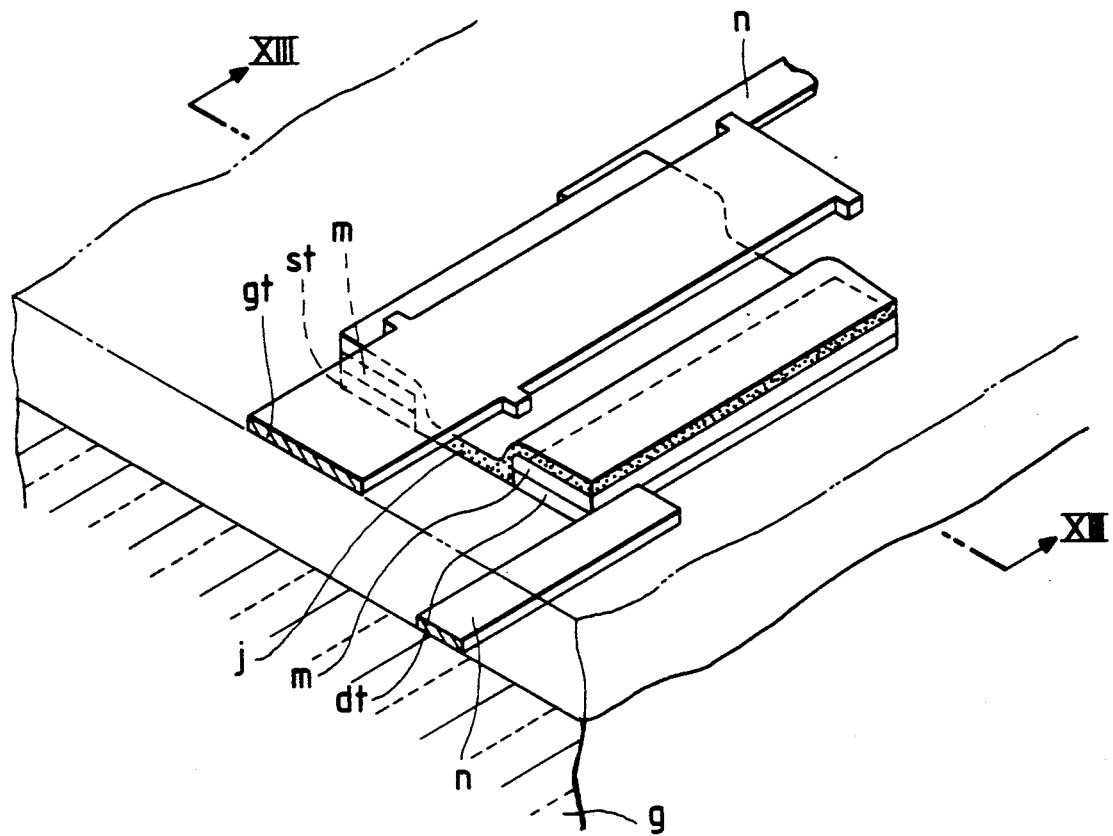
FIG. 12 is a schematic perspective view of a prior art "staggered" thin-film MOS transistor.
Figure 13:
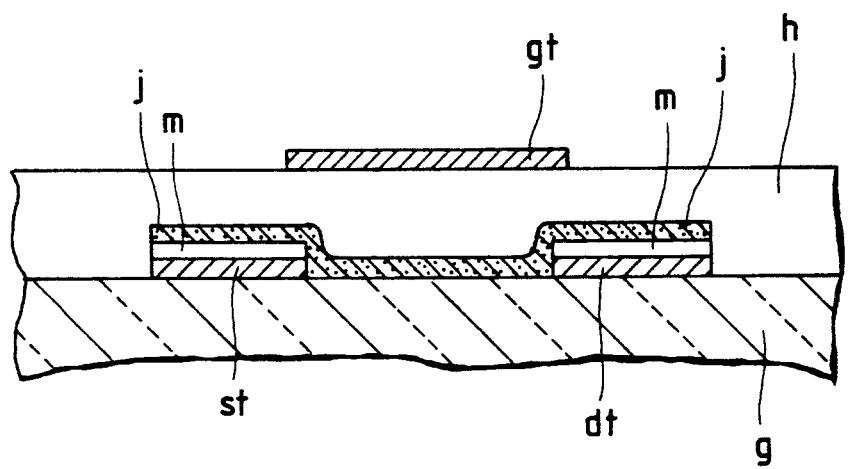
FIG. 13 is a cross section of FIG. 12 taken on the line XIII—XIII.

In the next step, a uniform tantalum (Ta) film having a thickness of about 1,000 Å is deposited on the first signal wiring base 30' and on the glass substrate 1 by a sputtering technique, and is subjected to a similar etching treatment to form the first signal wiring 30 and the gate electrode 20. As shown in FIGS. 9A and 9B, the first signal wiring 30 is composed of the wiring base on the substrate side made of tantalum-molybdenum (TaMo) alloy and having a thickness of 300 Å, the intermediate overlying wiring part 35 made of 1,700 Å α-tantalum (α-Ta) and superposed on the wiring base 2, and the top overlying wiring part 36 made of 1,000 Å α-tantalum (α-Ta) and superposed on the intermediate wiring part 35. The gate electrode 20 is made of 1,000 Å tantalum (Ta) and formed so as to be integral with the top wiring part 36. The other components of the thin-film transistor than the gate electrode 20 and the first signal wiring 30 are formed by similar procedures to those employed in the first embodiment.

In the thin-film transistor according to the third embodiment described above, the intermediate overlying wiring part 35 grows inheriting the body-centered cubic lattice structure of the TaMo alloy of which the wiring base 2 is made to become composed or α-tantalum having a lower resistance value. In addition, the top wiring part 36 superposed on the intermediate wiring part 35 is also composed of α-tantalum having a low resistance value. As a result, the conductivity of the first signal wiring 30 is reduced to a significantly low level, which is 1 Ω/□ or below in terms of sheet resistance.

Hence, in spite of the gate electrode 20 being composed of β-tantalum having a relatively high resistance value, the thin-film transistor in accordance with the third embodiment of the present invention has the advantage that it can be operated at an even higher speed than the thin-film transistors according to the first and second embodiments.

Another advantage of the thin-film transistor according to the third embodiment of the present invention is that the thickness the gate electrode 20, which is composed of a single tantalum layer, can be sufficiently reduced to prevent occurrence of the breakdown between the gate and the drain.

Further, the first signal wiring 30, which is composed of the three layers, i.e., the wiring base on the substrate side 2, the intermediate overlying wiring part 35 and the top overlying wiring part 36, has an increased film thickness, and this offers the following advantage when a $Si_xN_y$ insulating film, that is formed simultaneously with the gate insulating film 4, is etched to form an exposed area: That is, even if the $Si_xN_y$/tantalum etching selectivity is so small that the first signal wiring part 30 undergoes some etching, no hole will be made in the wiring part 30 and hence the device yield is improved.

In the first and second aspects of the invention as described above, the insulating substrate may be made of glass, quartz, ceramics and other materials that are conventionally used in the art. The semiconductor layer to be provided on the insulating substrate may be formed of polysilicon, amorphous silicon (a-Si:H), etc.

In the first and second aspects of the invention, deposition of α-tantalum as a film is accomplished by forming the wiring base 2 on the insulating substrate. This wiring base on the substrate side is formed of a conductive material that has a body-centered cubic lattice structure with its lattice constants either the same as or similar to those of α-tantalum, and examples of such a conductive material include TaMo (tantalum-molybdenum) alloy and TaW (tantalum-tungsten) alloy. Other useful conductive materials are Mo (molybdenum), W (tungsten) and other materials that react with tantalum as the overlying wiring part 3 (in the first aspect) or intermediate overlying wiring part 35 (in the second aspect) to form the TaMo alloy, TaW alloy, etc., and which themselves have a body-centered cubic lattice structure.

When using molybdenum, tungsten, etc. as conductive materials to form the wiring base on the substrate side 2, care must be exercised in the following point. In the case where the first wiring member in the first aspect of the invention is the gate electrode 20, if molybdenum or tungsten remains in the wiring base, a trouble can occur when the gate electrode 20 is anodized to increase its withstand voltage because both elements are difficult to oxidize. Hence, the wiring base on the substrate side must be thin enough to insure that when a tantalum film is deposited as the overlying wiring part 3, 35, most of said wiring base 2 has become composed of TaMo or TaW.

"Handbook of Thin Film Technology" published by McGRAW-HILL BOOK COMPANY contains resistivity ($\mu\Omega\cdot cm$) data on β-tantalum having a tetragonal lattice structure and α-tantalum having a bcc lattice structure. According to the data, β-tantalum has a resistivity of 180–220 $\mu\Omega\cdot cm$ whereas α-tantalum has a lower resistivity of 25–50 $\mu\Omega\cdot cm$, which is comparable to the bulk metal (13 $\mu\Omega\cdot cm$).

What is claimed is:

1. A thin-film semiconductor device having an insulating substrate, a semiconductor layer formed on the insulating substrate, and a first wiring member formed on the insulating substrate with at least part of the first wiring member being in surface contact with the insulating substrate, wherein the first wiring member of said device comprises:
 a wiring base on the insulating substrate side, said wiring base being formed of a conductive material having a body-centered cubic lattice structure with its lattice constants either the same as or approximately identical to those of α-tantalum; and an overlying wiring part formed of α-tantalum superposed on the wiring base.

2. The device according to claim 1, wherein the conductive material is tantalum-molybdenum alloy.

3. The device according to claim 1, wherein the first wiring member includes a gate electrode of a reverse staggered MOS thin-film transistor and a signal wiring connected to the gate electrode.

4. A thin-film semiconductor device having a plurality of thin-film semiconductor elements and an active matrix wiring circuit provided on a common insulating substrate, in which both a first signal wiring of the active matrix wiring circuit and an electrode on the substrate side of each of the plurality of thin-film semiconductor elements are in surface contact with the insulating substrate, said device comprising:

the first signal wiring of the active matrix wiring circuit including a wiring base on the substrate side and being formed of a conductive material having a body-centered cubic lattice structure with its lattice constants either the same as or approximately identical to those of α-tantalum, an intermediate overlying wiring part formed of α-tantalum and superposed on the wiring base, and a top overlying wiring part formed of α-tantalum superposed on the intermediate overlying wiring part; and the electrode on the substrate side of each of the plurality of thin-film semiconductor elements including a single thin layer of tantalum that is integral with the top overlying wiring part of the first signal wiring.

5. The device according to claim 4, wherein the conductive material is tantalum-molybdenum alloy.

6. The device according to claim 4, wherein the electrode on the substrate side is a gate electrode of a reverse staggered MOS thin-film transistor, and the first signal wiring is a signal wiring connected to the gate electrode.

7. The device according to claim 4, wherein the electrode on the substrate side includes source and drain electrodes of a staggered MOS thin-film transistor, and the first signal wiring comprises signal wirings connected to the source and drain electrodes, respectively.

8. A thin-film semiconductor device having an insulating substrate, a semiconductor layer formed on the insulating substrate, and two first wiring members formed on the insulating substrate with at least part of each first wiring member being in surface contact with the insulating substrate, wherein each first wiring member of said device comprises:

a wiring base on the insulating substrate side, said wiring base being formed of a conductive material having a body-centered cubic lattice structure with its lattice constants either the same as or approximately identical to those of α-tantalum; and an overlying wiring part formed of α-tantalum superposed on the wiring base.

9. The device according to claim 8, wherein the conductive material is tantalum-molybdenum alloy.

10. The device according to claim 8, wherein the two first wiring members comprise a source and a drain electrode of a staggered MOS thin-film transistor and signal wirings connected to the source and drain electrodes, respectively.

* * * * *